(12) United States Patent
Ho

(10) Patent No.: US 7,317,327 B1
(45) Date of Patent: Jan. 8, 2008

(54) ADJUSTABLE DATA LOADING CIRCUIT WITH DYNAMIC TEST MODE SWITCHING FOR TESTING PROGRAMMABLE INTEGRATED CIRCUITS

(75) Inventor: Eng Ling Ho, Simpang Ampat (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/784,381

(22) Filed: Apr. 6, 2007

Related U.S. Application Data

(63) Continuation of application No. 11/036,074, filed on Jan. 13, 2005, now Pat. No. 7,218,134.

(51) Int. Cl.
*H03K 19/00* (2006.01)
(52) U.S. Cl. .............................. 326/16; 326/38; 326/41
(58) Field of Classification Search .................. 326/16, 326/37–47
See application file for complete search history.

(56) References Cited

U.S. PATENT DOCUMENTS

| | | | |
|---|---|---|---|
| 6,028,798 A | 2/2000 | Roohparvar | |
| 6,189,115 B1 * | 2/2001 | Whetsel | 714/28 |
| 6,202,185 B1 | 3/2001 | Lee | |
| 6,304,094 B2 | 10/2001 | Gilliam | |
| 6,481,000 B1 | 11/2002 | Zaveri | |
| 6,680,871 B1 | 1/2004 | Price | |
| 6,834,375 B1 | 12/2004 | Stine | |
| 6,842,039 B1 | 1/2005 | Guzman et al. | |
| 7,218,134 B1 * | 5/2007 | Ho | 326/16 |

* cited by examiner

*Primary Examiner*—Anh Q. Tran
(74) *Attorney, Agent, or Firm*—G. Victor Treyz

(57) ABSTRACT

Methods and apparatus for testing programmable integrated circuits are provided. Programmable integrated circuits include programmable elements that are loaded with configuration data to program programmable logic to perform a custom logic function. The programmable integrated circuits receive test configuration data from a tester to program the programmable logic into a test configuration. After the programmable integrated circuit has been placed into the test configuration by loading the test configuration data, test vectors are applied to the programmable integrated circuit to evaluate its performance. Test configuration data loading circuits are used in the programmable integrated circuits to control how the test configuration data is loaded into the programmable elements. When the adjustable circuits are placed in a low bandwidth configuration, relatively few input lines are used to load the test configuration data. When the adjustable circuits are placed in a high bandwidth configuration, test data can be loaded quickly.

12 Claims, 15 Drawing Sheets

| | T1 | T2 |
|---|---|---|
| $D_{OUT-1}$ | $D_{IN1}(T1)$ | $D_{IN1}(T2)$ |
| $D_{OUT-2}$ | $D_{IN2}(T1)$ | $D_{IN2}(T2)$ |
| $D_{OUT-3}$ | X | $D_{IN1}(T1)$ |
| $D_{OUT-4}$ | X | $D_{IN2}(T1)$ |

ADJUSTABLE DATA LOADING CIRCUIT WITH DYNAMIC TEST MODE SWITCHING FOR TESTING PROGRAMMABLE INTEGRATED CIRCUITS

This application is a continuation of patent application Ser. No. 11/036,074, filed Jan. 13, 2005 now U.S. Pat. No. 7,218,134, which is hereby incorporated by reference herein in its entirety.

BACKGROUND OF THE INVENTION

This invention relates to circuit testing, and more particularly, to circuits with dynamic test mode switching capabilities for use when testing programmable integrated circuits such as programmable logic device integrated circuits.

Programmable logic devices are a type of integrated circuit that can be customized by a user to implement a desired logic design. In a typical scenario, a logic designer uses a logic design system to design a logic circuit. The logic design system uses information on the hardware capabilities of a given programmable logic device to help the designer implement the logic circuit using the resources available on that given programmable logic device. The logic design system creates configuration data. When the configuration data is loaded into the programmable logic device, it programs the logic of the programmable logic device so that the programmable logic device implements the designer's logic circuit.

To test a programmable logic device, the programmable logic device is loaded with test configuration data. Groups of test signals called test vectors are applied to the inputs of the programmed device and the resulting output signals are monitored.

During testing, it is often necessary to load hundreds or thousands of different sets of test configuration data into the programmable logic device. As a result, it is not uncommon for each device to take 6-7 seconds to test. In a production environment, this is a considerable delay.

High-speed testing arrangements have been developed to address the delays associated with testing programmable logic devices. With these arrangements, a set of parallel lines is used to help speed up the process of loading test configuration data. However, such high-speed testing arrangements require large numbers of free input pins, which are not always available, particularly with smaller packages.

It would therefore be desirable to provide improved ways in which to load test configuration data during testing speed of programmable integrated circuits such as programmable logic device integrated circuits.

SUMMARY OF THE INVENTION

In accordance with the present invention, methods and apparatus are provided for testing programmable integrated circuits. A programmable integrated circuit has programmable elements that are loaded with configuration data. The configuration data in the programmable elements is used to configure programmable logic on the circuit to perform a custom logic function. To test programmable integrated circuits, one or more sets of test configuration data are loaded into the programmable elements. Once the test configuration data is loaded into the programmable elements, test vectors are applied to the programmable integrated circuit to analyze its behavior.

Test configuration data is loaded into the programmable elements in parallel over parallel test configuration data loading lines. A test configuration data loading circuit that supports dynamic test mode switching is used to load test configuration data. The data loading circuit has an adjustable bandwidth. The dynamic test mode capabilities of the test configuration data loading circuit are used to control how test configuration data is routed to the programmable elements. The data loading circuit has a control signal input to which hardwired control signals or control signals from a tester may be applied.

When it is desired to load test configuration data into the programmable elements using relatively few input pins, the test configuration data loading circuit is configured so that the test data from relatively few input pins is routed to all of the parallel test configuration data loading lines. In this configuration, the test configuration data loading circuit has a relatively low bandwidth. When it is desired to load test configuration data into the programmable elements at high speed, a relatively larger number of input pins may be used to increase bandwidth. In this situation, the test configuration data loading circuit is configured so that it supplies a higher loading bandwidth in which the test data from the larger number of input pins is routed to the test configuration data lines. Loading speed is minimized at the expense of using a larger test data input bus width.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to testing integrated circuits. In particular, the invention relates to circuitry that is incorporated into integrated circuits to facilitate testing and to systems and methods for performing testing operations.

The integrated circuits being tested in accordance with the invention may be, for example, programmable logic devices. The invention also applies to the testing of integrated circuits with programmable capabilities that are not typically referred to as "programmable logic devices." Such programmable integrated circuits may include, for example, application specific integrated circuits with regions of programmable logic, digital signal processors containing programmable logic, microprocessors or microcontrollers with programmable logic regions, etc. Aspects of the invention may also apply to integrated circuits that do not contain significant amounts of programmable logic. For clarity, however, the present invention will be described in the context of programmable integrated circuits such as programmable logic devices.

Figure 1:
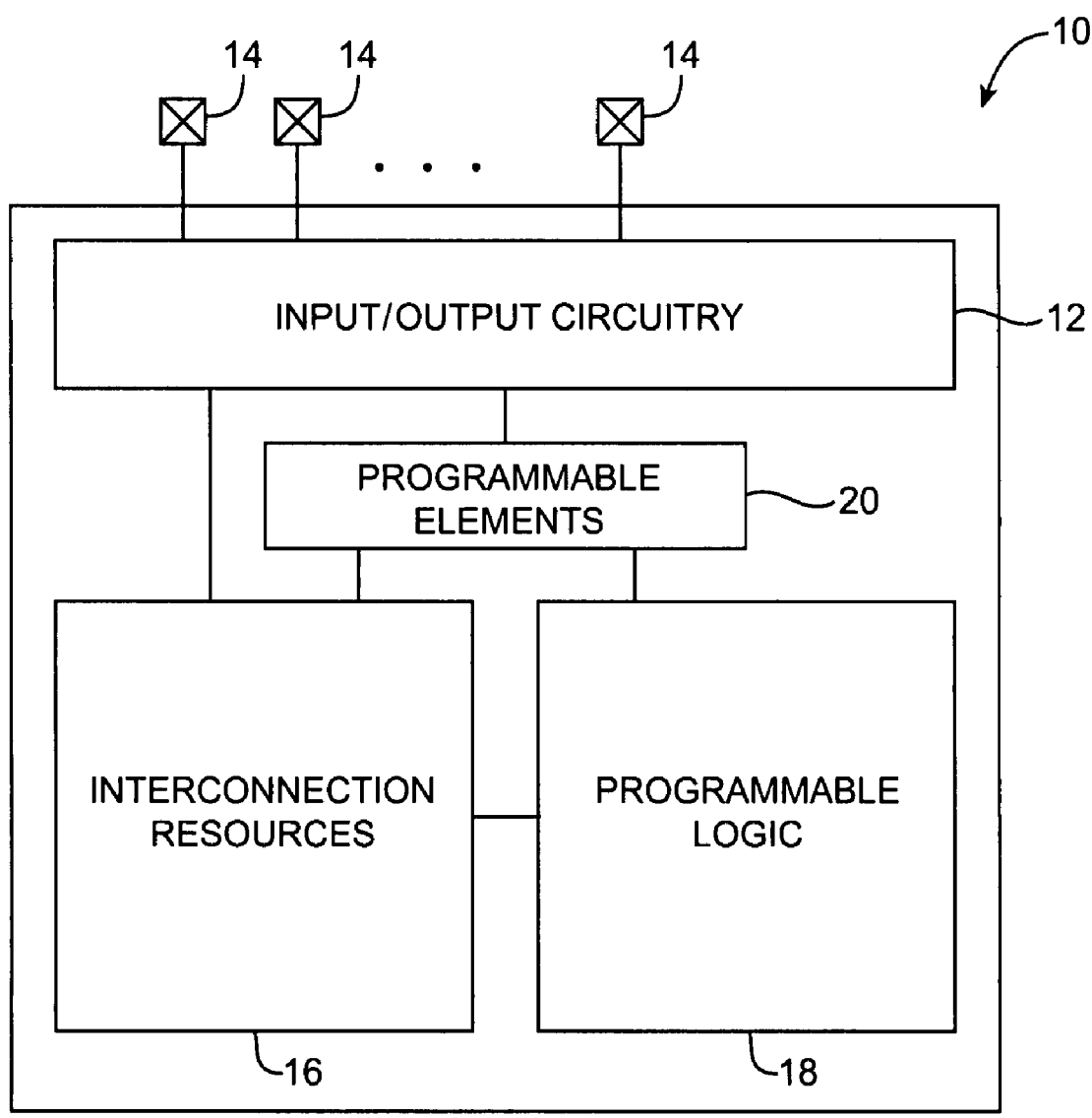
FIG. 1 is a circuit diagram of an illustrative programmable logic device integrated circuit in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Programmable logic 18 may include combinational and sequential logic circuitry including logic gates, multiplexers, memory blocks, look-up-tables, logic arrays, etc. These illustrative components are not mutually exclusive. For example, look-up tables and other components include logic gates. Some of the logic of programmable logic device 10 is fixed. Programmable logic 18 includes components that may be configured so that device 10 performs a desired custom logic function.

Programmable logic device 10 may be based on any suitable programmable technology. With one suitable approach, configuration data (also called programming data) may be loaded into programmable elements 20 using pins 14 and input/output circuitry 12. Once loaded, the programmable elements (also sometimes called configuration bits or programmable function control elements) may each provide a static control output signal that controls the state of an associated logic component in programmable logic 18.

In a typical arrangement, the programmable elements 20 may be based on registers, latches, or other configuration data storage elements based on random-access memory (RAM) cells that are loaded with configuration data from an external chip via pins 14 and input/output circuitry 12. The external chip may be a controller chip coupled to a memory chip or an integrated memory and controller chip.

The loaded RAM cells or other programmable elements 20 provide static control signals that are applied to the terminals (e.g., the gates) of circuit elements (e.g., metal-oxide-semiconductor transistors) in programmable logic 18 to control those elements (e.g., to turn certain transistors on or off) and thereby configure the logic in programmable logic 18. Circuit elements in input/output circuitry 12 and interconnection resources 16 are also generally configured as part of the programming process. The circuit elements that are configured in input/output circuitry 12, interconnection resources 16, and programmable logic 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for at least some of device 10 include technologies in which programmable elements are formed from electrically-programmable read-only-memory (EPROM) or erasable-electrically-programmable read-only-memory (EEPROM) technology, magnetic storage elements, etc. Device 10 may also contain logic that is programmed using mask-programming, fuses, antifuses, etc.

Regardless of the particular type of programmable element arrangement that is used for device 10, programmable elements are preferably provided with configuration data. When provided with configuration data, the programmable elements 20 selectively control (e.g., turn on and off) portions of the circuitry in the programmable logic 18 and thereby customize its functions so that it will operate as desired.

When testing a device 10, test configuration data is loaded into the programmable elements using a tester. When operating a device 10 normally in a system, configuration data created by a logic designer is loaded into the programmable elements (e.g., using an integrated memory/control circuit or other suitable arrangement).

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more levels or layers in which multiple large areas are interconnected to form still larger portions of logic. Still other device arrangements may use logic that is not arranged in rows and columns.

It can be a significant undertaking to design and implement a desired logic circuit in a programmable logic device. Logic designers therefore generally use logic design systems based on computer-aided-design (CAD) tools to assist them in designing circuits. These CAD tools allow a logic designer to convert a high-level logic design into configuration data for programming a device.

Computer-based testing systems ("testers") are used to perform tests on programmable logic devices during the manufacturing process. In a typical scenario, a tester is used to program a programmable logic device with test configuration data. After the device has been programmed with the test configuration data, test input signals ("test vectors") are applied to the device. As the test vectors are applied to the device, the resulting output signals ("output vectors") from the device are monitored. The behavior of the device may be analyzed by comparing the output vectors that are produced by the device to predicated output vector values.

To thoroughly test a device, it is often necessary to program the device with hundreds or thousands of different sets of test configuration data. After each new configuration is loaded into the device, the performance of the device is evaluated using test vectors.

Figure 2:
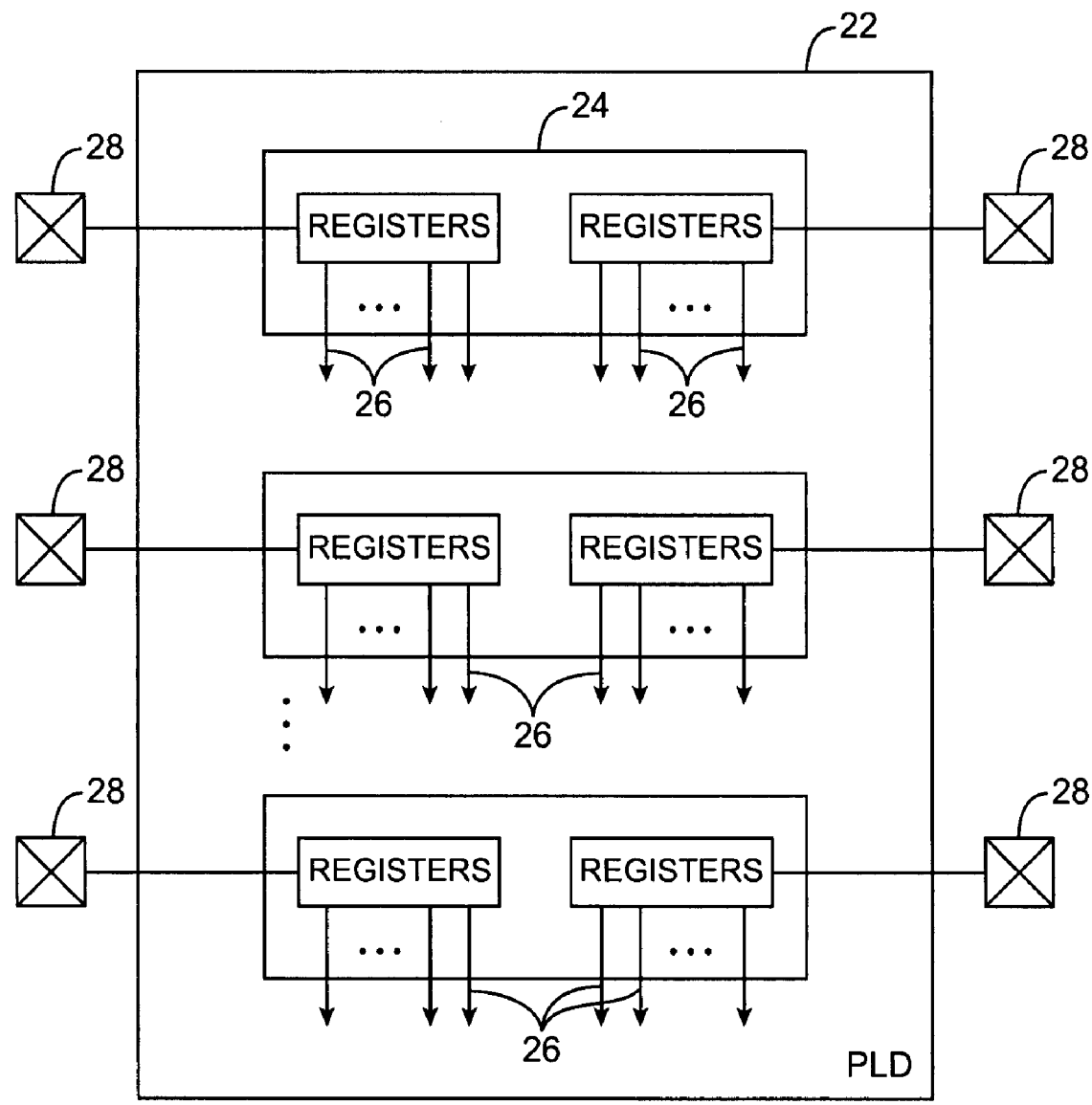
FIG. 2 is a circuit diagram of a conventional regular-test-mode circuit for use in testing a programmable logic device integrated circuit.

A conventional arrangement for loading configuration data into a programmable logic device 22 is shown in FIG. 2. Device 22 contains programmable logic that is programmed by loading configuration data into registers 24. The outputs 26 of the registers are connected to control inputs in the programmable logic. The states of the outputs 26 are governed by the values of the bits of configuration data loaded into registers 24 via input/output pins 28. In a typical layout, there are multiple rows of registers 24 in device 22, each of which has a corresponding left-hand pin 28 and a corresponding right-hand pin 28. The test configuration data in the left portion a row is loaded through the left-hand pin 28 while the test configuration data in the right portion of the row is loaded through the right-hand pin 28.

The conventional arrangement of FIG. 2 is sometimes referred to as a "regular test mode" arrangement. With a regular test mode approach, test configuration data is loaded serially. If, as an example, there are 70 register bits to be loaded in a row, 35 clock cycles are required to load the test data into registers 24. During these 35 clock cycles, the left-hand 35 registers 24 in a row are loaded through that row's left-hand pin 28 and the right-hand 35 registers 24 in the row are loaded through that row's right-hand pin 28.

Although it typically takes only a fraction of a second to load a set of test configuration data into a programmable logic device, the total time required to test a device can be non-negligible when there are numerous sets of test configuration data involved. Tests requiring the loading of 100s or 1000s of different sets of test configuration data may take over 5 seconds to complete, which tends to reduce the throughput of the tester.

Figure 3:
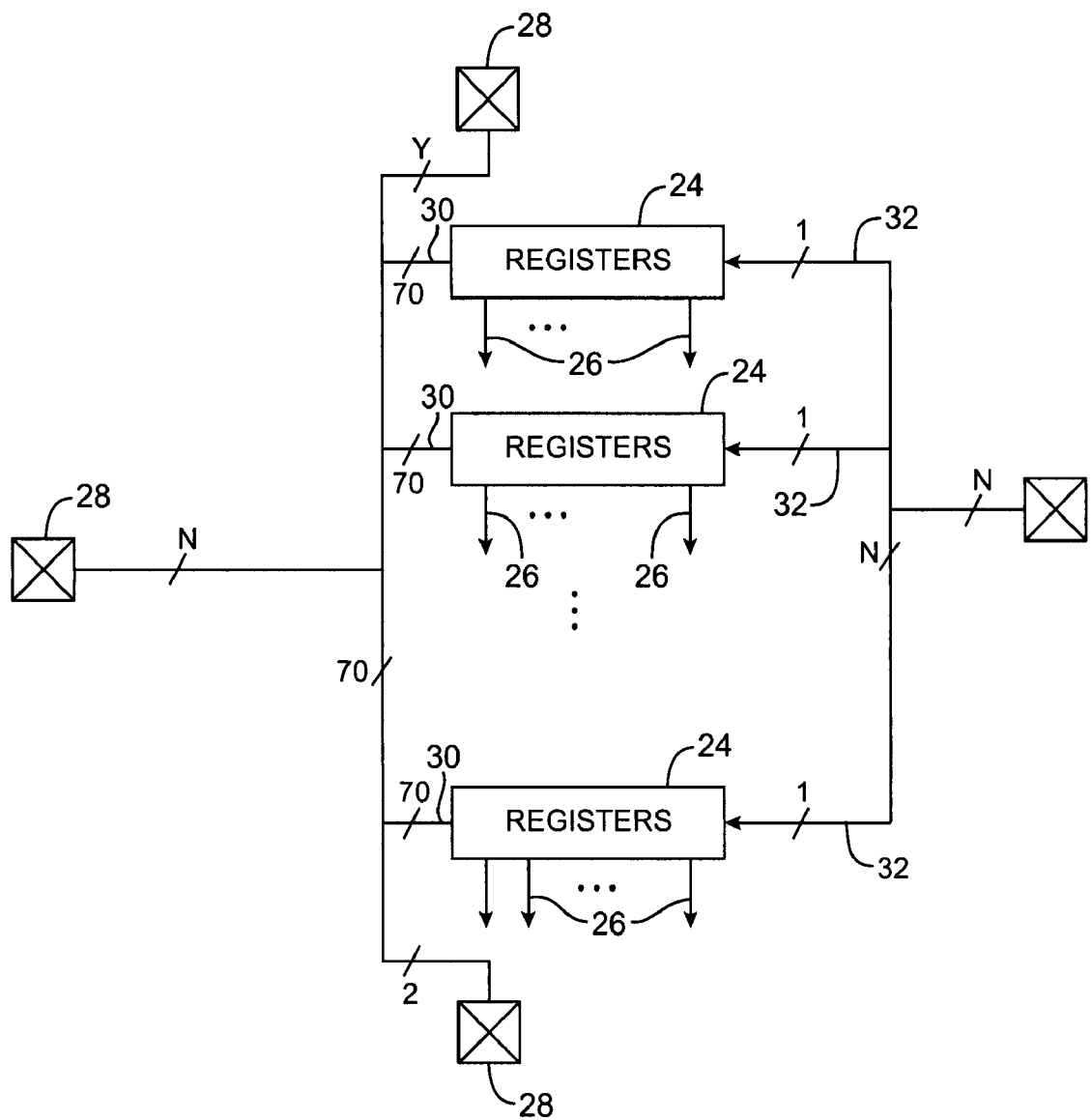
FIG. 3 is a circuit diagram of a conventional high-speed-test-mode circuit for use in testing a programmable logic device integrated circuit.

To increase throughput, parallel test data loading techniques have been developed. With this type of approach (commonly referred to as "high-speed-test-mode testing), test configuration data is loaded in parallel. A conventional high-speed-test-mode arrangement that has been used for testing programmable logic devices is shown in FIG. 3. With the arrangement of FIG. 3, each row of registers 24 is provided with test configuration data using 70 parallel lines 30. Row select signals are applied to registers 24 via row select lines 32 to choose which row is to be loaded at a given time. Multiple rows can be loaded in parallel if the test configuration data for each of these rows is identical.

Because there are so many more test configuration data loading lines 30 associated with each row of registers 24 in the arrangement of FIG. 3 than for the arrangement of FIG. 2, the process of loading test configuration data into the programmable logic device of FIG. 3 is much faster than that of FIG. 2. For example, the high-speed-test-mode arrangement of FIG. 3 allows 70 registers in each row to be loaded in a single clock cycle instead of the 35 clock cycles that would be required using the arrangement of FIG. 2.

However, the high-speed-test-mode circuitry of FIG. 3 requires a large number of free input/output pins 28. In particular, the arrangement of FIG. 3 requires 70 available pins 28 through which to provide the test configuration data to the 70 lines 30. In FIG. 3, there are N pins on the left-hand side of the programmable logic device and N pins on the right-hand side of the programmable logic device. If the value of N is greater than 70 in the packaging used for a given programmable logic device, the requirement of 70 available pins 28 may be met using the left-hand pins 28. In certain packages, the value of N may be less than 70, but there may be additional pins (i.e., Y additional pins on the top of FIG. 3 and Z additional pins on the bottom of FIG. 3) in the device through which test configuration data may be supplied. In these packages, the total number of pins (N+Y+Z) must be at least 70.

Because of the high pin counts required to implement high-speed-test-mode architectures, high-speed test mode arrangements often cannot be used, forcing a programmable logic device integrated circuit designer to use a slower regular test mode arrangement of the type shown in FIG. 2.

In accordance with the present invention, programmable logic devices are provided with a test configuration data loading circuit that allows test configuration data to be loaded into programmable logic devices in parallel using a selectable number of input/output pins and an adjustable bus width. The test configuration data loading circuit (also sometimes called an adjustable bus width circuit or adjustable bandwidth circuit) includes time-division-multiplexing circuitry that can be adjusted to accommodate various different programmable logic devices and packages.

If it is desired to package a given programmable logic device in a package with relatively few pins, the time-division-multiplexing circuitry can be adjusted so that test configuration data is loaded through a relatively small number of pins. If, on the other hand, it is desired to package the given programmable logic device in a package with a larger number of pins, the time-division-multiplexing circuitry can be adjusted so that the test configuration data is loaded through a relatively larger number of pins. Because the same time-division-multiplexing circuitry arrangement can be used for the same programmable logic device in different packages, a variety of packaging environments can be supported with the same circuit designs.

Adjustments to the time-division-multiplexing circuitry of the test configuration data loading circuit can be made by applying appropriate control signals to the circuitry during testing. If desired, adjustments can be made by hardwiring the circuitry during packaging so that hardwired control signals will be applied during testing. The adjustments made to the adjustable circuit assure that an appropriate number of pins are used to load the test configuration data.

Figure 4:
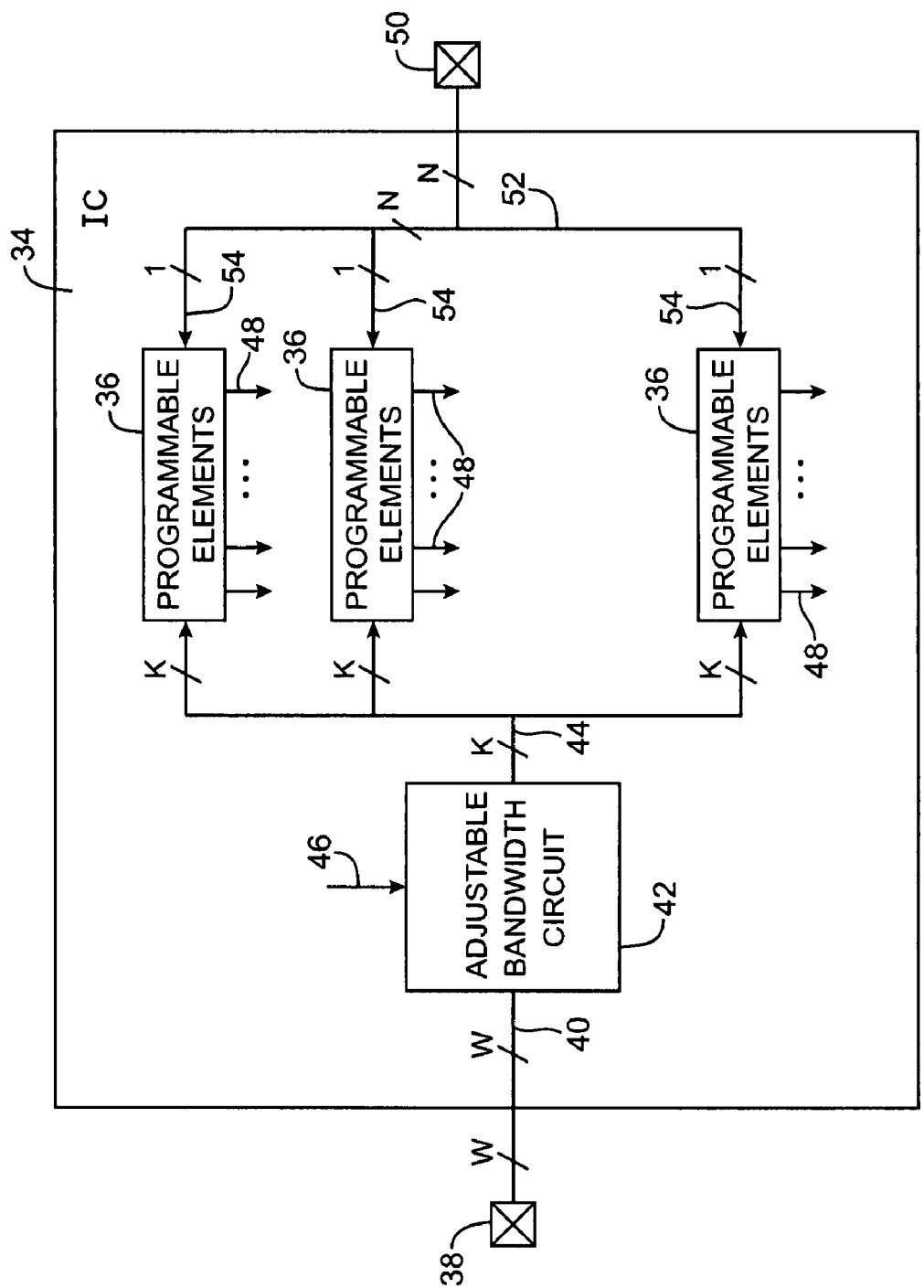
FIG. 4 is a circuit diagram of an illustrative programmable integrated circuit with test configuration data loading circuitry that supports an adjustable bandwidth path for loading test configuration data in accordance with the present invention.

An illustrative integrated circuit 34 in accordance with the present invention is shown in FIG. 4. Integrated circuit 34 may be a programmable logic device or other integrated circuit with programmable logic. The programmable logic of device 34 may be programmed by loading configuration data into programmable elements 36. Programmable elements 36 may be provided in the form of data registers, latches, or any other suitable programmable data storage devices. Elements 36 may be arranged in rows, as shown in FIG. 4, or may be placed on device 34 using any other suitable architecture.

Once loaded with configuration data, each programmable element 36 produces an output control signal on a corresponding output line 48. Each output 48 is connected to the input of a device (e.g., a transistor or other electrical component) in the programmable logic portion of circuit 34. The states of the output signals 48 control the programming of the programmable logic.

Configuration data for integrated circuit 34 may be provided to circuit 34 through input/output pins (sometimes called input pins) 38. In the example of FIG. 4, there are W pins 38 connected to W corresponding input lines 40. Lines 40 are connected to the input of adjustable circuit 42 and form a bus of width W. The adjustable circuit 42 has a control input 46 for receiving control signals. An output bus 44 is used to provide output signals from circuit 42. As shown in FIG. 4, the width of the output bus is K, because there are K parallel output lines 44 connected to circuit 42.

The values of W and K need not be the same.

For example, W may be 5 and K may be 10. In this situation, configuration data may be provided on 5 parallel input pins 38 connected to a bus formed from 5 parallel input lines 40. Adjustable circuit 42 may route the configuration data to 10 corresponding output lines 44. In this example, the width of the bus formed by lines 40 is 5 and the width of the bus formed by lines 44 is 10. The circuit 42 is therefore being used to expand the bus width from 5 to 10.

As another example, W may be 10 and K may be 70. In this example, circuit 42 expands the width of the bus from 10 to 70 (a 1:7 expansion).

As these examples demonstrate, the test configuration data loading circuit is used to map W pins 38 and corresponding input lines 40 into K lines 44. Lines 40 form a first bus of parallel lines of width W. The lines 44 at the output of circuit 42 form a second bus of parallel lines. The bus formed by lines 44 has K signal lines that may be routed to each row of programmable elements 36, as shown in FIG. 4.

The control signals provided to input 46 of adjustable circuit 42 control the operation of circuit 42. For example, control signal input 46 may be used to adjust circuit 42 so that the width of the bus 40 is unchanged (i.e., W=K), so that the width of the bus 40 is expanded by a factor of 2 (i.e., the bus width is doubled), so that the width of bus 40 is expanded by a factor of 3 (i.e., the bus width is tripled so that there are 3× as many active lines in bus 44 as there are lines 40), etc.

The value of K is generally greater than 1, so that data is provided to programmable elements in parallel. For example, if there are 70 programmable elements in a row, K may be 70, so that each of the K programmable elements 36 may be loaded by a respective line 44 in the bus, using a single clock cycle. The value of W is related to the size of the package used to package the integrated circuit 34.

When a low-pin-count package is used or when it is otherwise desired to minimize the number of pins used to load configuration data, W is relatively small. In this situation, the time-division-multiplexing circuitry in circuit 42 ensures that all of the signals on the W parallel lines 40 are mapped to appropriate lines 44 that are connected to the programmable elements 36, but loading speed is reduced by the relatively narrow width of bus 40 and the relatively low bandwidth of circuit 42.

When a high-pin-count package is used or when it is otherwise desired to minimize loading times, W is relatively large. In this situation, the time-division-multiplexing circuitry in circuit 42 may be bypassed or may be used to expand the width of bus 40 only slightly when routing the configuration data to the K lines 44 connected to programmable elements 36. Although more pins 38 are involved in this type of arrangement, the bandwidth available for loading the configuration data is increased, so that loading times are minimized.

Because the bandwidth used to load the configuration data may be adjusted based on the number of pins to be used for data loading and based on desired loading times, a programmable logic device integrated circuit designer can use a configuration data loading architecture of the type shown in FIG. 4 in a wide variety of programmable logic device circuit designs. For example, a programmable logic device integrated circuit designer can use a single adjustable circuit 42 to accommodate a number of different packages for a given programmable logic device integrated circuit. The same circuit 42 can be fabricated on each programmable logic device 34 and can then be adjusted by applying suitable control signals to input 46 during testing.

During loading, a row select signal may be applied to the row or rows into which it is desired to load configuration data. The row select signals may be applied to each row using row select lines 54.

As shown in FIG. 4, there may be a single row select line 54 associated with each row of programmable elements 36. If there are N rows, a bus of width N such as bus 52 of FIG. 4 may be used to distribute N independent signals to the N rows 54. The lines in bus 52 may be connected to respective input pins 50 as shown in FIG. 4. If the configuration data for multiple rows is identical, each of these multiple rows may be loaded simultaneously. As an example, if the configuration data destined for rows 3 and 7 is identical, rows 3 and 7 can be loaded at the same time by activating the row select lines for rows 3 and 7 at the same time while the remaining row select lines are held inactive. The row select signals may be applied to appropriate pins 50 using a tester during testing.

Figure 5:
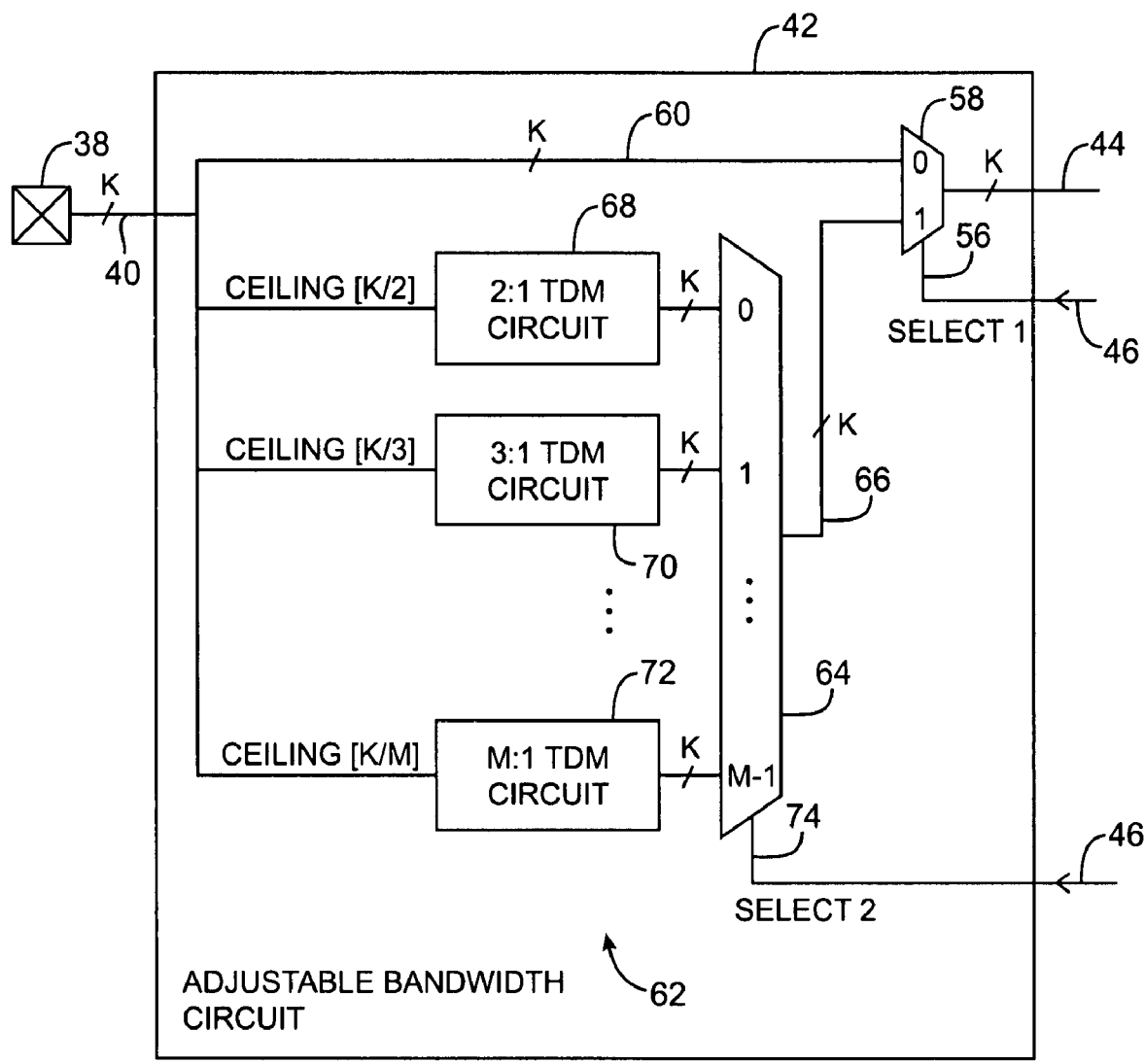
FIG. 5 is a circuit diagram of illustrative test configuration data loading circuitry that may be used in a programmable integrated circuit of the type shown in FIG. 4 in accordance with the present invention.

Any suitable circuitry may be used to implement the adjustable bus width and adjustable bandwidth operations of circuit 42. An illustrative test configuration data loading circuit 42 is shown in FIG. 5. In the example of FIG. 5, the width of bus 44 is K and K lines 40 are connected to K corresponding pins 38. With this type of arrangement, the test configuration data loading mode that is used during testing can be adjusted to accommodate different desired combinations of pins and data loading bandwidths. In particular, the number of pins 38 that are used to load data (W) can be adjusted to be as many as K (i.e., W is less than or equal to K). If it is desired to use all K input pins, circuit 42 is adjusted so that the time-division-multiplexing circuitry 62 of circuit 42 is bypassed. In situations in which the number of lines used to load data in bus 40 is less than output bus 44, the time-division-multiplexing circuitry of circuit 42 is used to map configuration data signals from the narrower input bus 40 to the wider output bus 44.

The control signals for adjusting circuit 42 are applied to circuit 42 at input 46. As shown in FIG. 5, a SELECT1 signal is applied to a control input 56 of bypass multiplexer 58.

When the SELECT1 signal is low (in this example), the K input lines 40 that are connected to the respective K pins 38 are connected by the K bypass lines 60 to the K output lines 44. This bypasses time-division-multiplexing circuitry 62.

When the SELECT1 signal is high (in this example), some of the K signal lines 40 and associated input pins 38 shown in FIG. 5 are not used to load configuration data. The pins 38 that are used to load data provide signals to associated lines 40 that flow through an appropriate one of the parallel time-division-multiplexing circuits 62 and multiplexer 64 for presentation on K lines 66 at the "1" input of multiplexer 58. Because the SELECT1 signal is high (in this example), the K lines 66 are connected to the K output lines 44.

Each time-division-multiplexing circuit 62 expands the width of the bus at its input to a bus of width of K at its output. By adjusting circuit 42 so that an appropriate one of circuits 62 is used, a correspondingly appropriate number of input pins 38 may be dynamically switched into use to route test configuration data to the programmable elements 36 of integrated circuit 34 (FIG. 4) during data loading operations.

In the illustrative circuit 42 of FIG. 5, time-division-multiplexing (TDM) circuits 62 include circuits with various different ratios. For example, circuits 62 include 2:1 time-division-multiplexing circuit 68, a 3:1 time-division-multiplexing circuit 70, and additional circuits with integral ratios, up to and including circuit 72, which has an M:1 ratio.

The ratio of each of circuits 62 corresponds to the ratio of its output bus width (K) to its input bus width. For example, a 2:1 time-division-multiplexing circuit 68 has a width expansion ratio of 2:1, because it has twice as many output lines as input lines. If, as an example, five lines 40 were used to provided data to 2:1 time-division-multiplexing circuit 68, circuit 68 would route the data from these five lines to ten output lines 44. If the number of output lines is not even, the number of input lines used to feed 2:1 circuit 68 would be slightly more than one half of K. In particular, W would be would be CEILING [K/2]. The CEILING function produces a rounded-up integer output given potentially non-integral inputs—e.g., CEILING[3.4] is 4.

In performing the bus width expansion functions of circuit 42, multiple clock cycles are used. For example, producing K output signals with circuit 68 from K/2 input signals requires two clock cycles.

When circuits 62 are not bypassed using bypass lines 60, the SELECT2 control signal applied to control input 74 of multiplexer 64 controls which time-division-multiplexing circuit 62 is switched into use. For example, if the SELECT2 control signal is "0", circuit 68 is switched into use. If the SELECT2 signal is "1," time-division-multiplexing circuit 70 is switched into use, etc.

When dynamically setting the test mode for circuit 42, the bandwidth for loading test configuration data with circuit 42 is adjusted by selection of appropriate values of SELECT1 and SELECT2. When it is desired to load test configuration data quickly, a relatively large number of pins 38 may be used to load test configuration data in parallel. When it is desired to load test data using a smaller number of pins, a tradeoff is made that conserves pins 38 at the expense of an increased data loading time.

Circuit 42 is in its highest throughput configuration when the time-division-multiplexing circuits 62 are bypassed. In this configuration, SELECT1 is 0. Bypass lines 60 are used to directly connect K input pins 38 to K corresponding lines 44. The K lines 44 are connected to the programmable elements (e.g., K programmable elements) in each row 36, as shown in FIG. 4. In this mode, there is a 1:1 mapping between the width of bus 40 and the width of bus 44.

When fewer pins are used due to packaging constraints, an appropriate time-division multiplexing circuit 62 may be switched into use. This is accomplished by setting SELECT1 to "1" to ensure that the time-division-multiplexing circuits 62 are in the loading path.

When circuits 62 are switched into use, the value of SELECT2 is selected to choose a time-division-multiplexing circuit with an appropriate bus expansion ratio. If, for example, K is equal to 90 and it is desired to use 30 input pins 38 to load test configuration data into 90 programmable elements 36 in each row, the value of SELECT2 may be set to "1," so that 3:1 time-division-multiplexing circuit 70 is switched into use. Because circuit 70 maps CEILING[K/3] input lines 40 and pins 38 to K output lines 44, only 30 input pins 38 are needed (in this example) to load the test configuration data in parallel to the 90 programmable elements 36 in each row. However, three clock cycles are required to load each row in this mode, because 3:1 time-division-multiplexing circuit 70 requires three clock cycles to fully populate the 90 lines 44 with the test configuration data from 30 input lines 40 and 30 pins 38.

All or part of the circuitry of FIG. 5 may be fabricated as part of integrated circuit 34. If all of circuitry 42 is included in a given integrated circuit design, this design can be switched into a desired mode to handle a wide range of test configuration data loading arrangements. If only some of the circuitry of FIG. 5 is included in a given design (e.g., if only one or a few of the circuits 62 are included and if bypass lines 60 are omitted), the design operates in fewer modes and can therefore handle a reduced range of test configuration data loading arrangements. Although circuits 42 with fewer bandwidth adjustment capabilities are relatively less flexible, such circuits 42 use fewer resources, which allows integrated circuits 34 that include such circuits 42 to be fabricated at lower cost.

In general, there is a tradeoff between the complexity of circuits 42 and the flexibility afforded by circuits 42. If circuits 42 are used that have few adjustment capabilities or have fixed capabilities (i.e., a single fixed time-division-multiplexing circuit 62), each circuit 42 will be compact and will use resources efficiently. However, the advantages of efficiently using resources in each circuit 42 in this way are offset to some degree by the disadvantages of decreased flexibility. If circuits 42 are insufficiently flexible, the efficiency with which a programmable logic device integrated circuit designer can design and implement a wide range of programmable logic device integrated circuits will be adversely affected. For example, if a circuit 42 has a fixed bandwidth, it will be extremely efficient to implement in a given programmable logic device integrated circuit. However, a fixed bandwidth circuit may be insufficiently flexible to allow the integrated circuit to be packaged in a wide variety of packages or may be required to have such a low bandwidth that the speed at which test configuration data is loaded in high-pin-count packages is adversely affected.

Figure 6A:
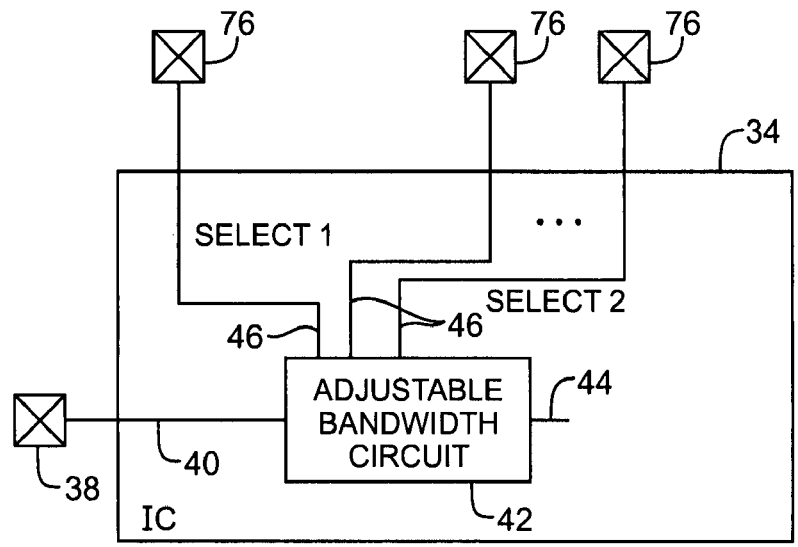
FIG. 6A is a circuit diagram of an illustrative configuration for adjusting the test configuration data loading circuitry of FIG. 5 using control signals from a tester in accordance with the present invention.

The bus width of test configuration data loading circuit 42 may be adjusted during testing by applying control signals. An illustrative arrangement in which control signals are used to adjust circuit 42 is shown in FIG. 6A. Adjustable circuit 42 of FIG. 6A is adjusted based on control signals such as the SELECT1 and SELECT2 control signals described in connection with FIG. 5. As shown in FIG. 6A, control signals such as the SELECT1 and SELECT2 control signals may be provided to circuit 42 via pins 76 and input 46. The control signals may be applied to pins 76 to adjust circuit 42 during testing, so that test configuration data can be loaded into the programmable elements of circuit 34. A tester may be used to generate and apply the control signals at pins 76.

Figure 6B:
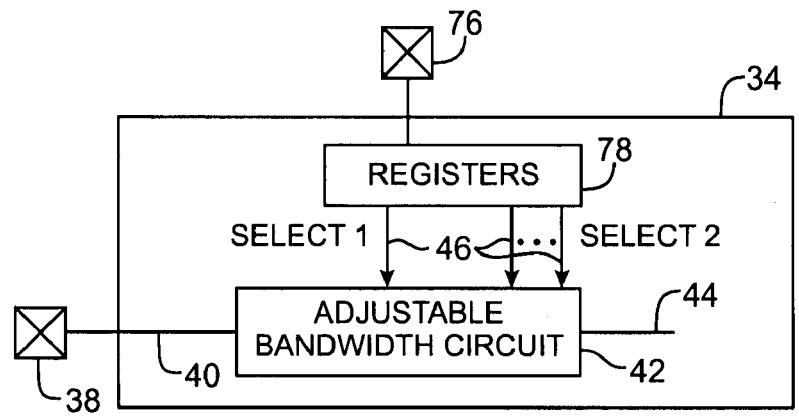
FIG. 6B is a circuit diagram of an illustrative configuration for adjusting the test configuration data loading circuitry of FIG. 5 using control signals loaded into registers in accordance with the present invention.

As shown in FIG. 6B, the control signals from the tester can be loaded into storage cells 78 (e.g., registers) whose outputs can then apply the control signals to circuit 42 via input 46. This type of arrangement uses fewer pins 76 than the arrangement of FIG. 6A, but requires additional clock cycles to load the control signals into circuit 34 and requires additional circuit resources (cells 78) on integrated circuit 34.

Figure 6C:
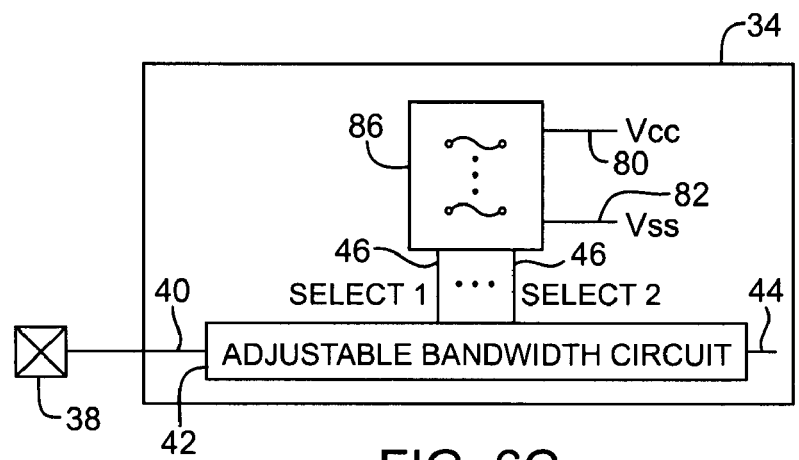
FIG. 6C is a circuit diagram of an illustrative configuration for adjusting the test configuration data loading circuitry of FIG. 5 using hardwired control signals in accordance with the present invention.

If desired, the adjustments to test configuration data loading circuit 42 may be made using a hardwired arrangement. This type of approach is shown in FIG. 6C. Integrated circuit 34 includes power supply lines and other lines that are at known potentials during operation of circuit 34. For example, integrated circuit 34 may contain lines at a positive voltage Vcc such as line 80 and lines at a ground voltage Vss such as line 82, as shown in FIG. 6C. The positive and ground signals from lines 80 and 82 serve as sources of digital high and low signals that control the operation of test configuration data loading circuit 42. During packaging operations or at another suitable time, the lines 80 and 82 can be electrically connected to the control signal input 46 of test configuration data loading circuit 42. When the circuit 34 is powered up during testing, the voltage from lines 80 and 82 serve as control signals for circuit 42.

Any suitable arrangement may be used to make hardwired connections for adjusting circuit 42. For example, a packager or other equipment may be used to make selective wire bonds, solder-ball connections, or other electrical connections between lines 80 and 82 and input 46. The connections that are made are represented schematically by connections 86 in FIG. 6C. If it is desired to make the SELECT1 signal high (e.g., a logical "1"), a wire bond or other electrical connection 86 may be formed between input 56 (FIG. 5) of multiplexer 58 and a source of positive potential (i.e., line 80). If, on the other hand, it is desired to make the SELECT1 signal low (e.g., a logical "0"), a wire bond or other connection 86 may be made between input 56 and a source of ground potential (i.e., line 82). The SELECT2 control signals may be adjusted by making hardwired connections 86 between lines 80 and 82 and inputs 74 (FIG. 5).

Figure 7:
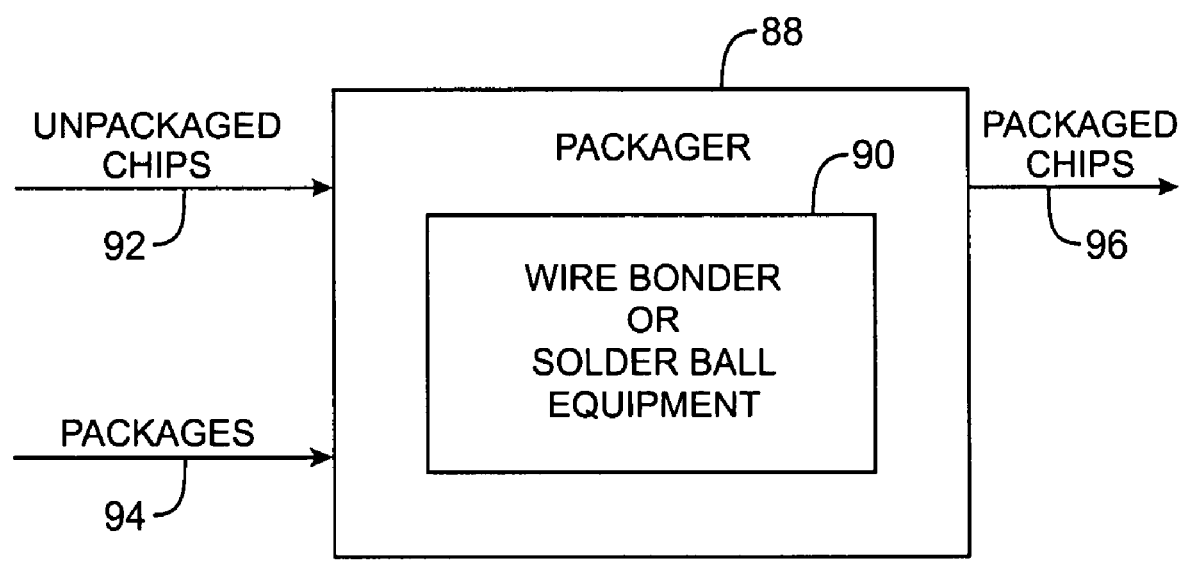
FIG. 7 is a diagram showing how a programmable integrated circuit may be packaged using a packager in accordance with the present invention.

A packager that may be used to make the connections 86 between lines 80 and 82 and appropriate control input lines in test configuration data loading circuit 42 is shown in FIG. 7. Packager 88 may include wire bonding equipment and/or solder-ball packaging equipment 90 or any other suitable packaging equipment to make electrical connections between circuit 34 and a package. As shown in FIG. 7, packager 88 receives unpackaged versions of integrated circuit 34 (shown as unpackaged integrated circuits 94 in FIG. 7) and receives packages 94 for these circuits as inputs. Any suitable type of package may be used to package circuits 94. Regardless of which type of package is used, the electrical connectors of the packages used to package circuit 34 are referred to as "pins."

The unpackaged integrated circuit 92 includes wire bonding pads, solder ball bonding pads, or other suitable conductive regions to which electrical connections may be made during packaging. These connections are used to connect the pins of the package such as pins 38 and other pins to the circuitry of the integrated circuit 34. The resulting packaged versions of integrated circuits 34 are provided as an output of packager 88 (shown as packaged chips 96 in FIG. 7). If it is not desired to make hardwired adjustments to test configuration data loading circuit 42, no connections 86 need be made and chips 96 may be installed in a system. If it is desired to make hardwired adjustments to test configuration data loading circuit 42, those adjustments are made by making appropriate connections 86 with packager 88 during the packaging process.

The use of packager 88 to make connections 86 is merely illustrative. Any suitable apparatus may be used to make hardwired control signal connections for adjusting circuit 42 if desired. For example, a stand-alone apparatus may be used to form hardwired connections from structures 86 (e.g., by laser programming or electrically programming fuses or antifuses, by making wire bonds between pads, etc.).

Integrated circuits 34 may be tested before and after packaging. Slightly different testing arrangements are typically used to test circuits 34 that have been packaged than are used to test circuits 34 that are unpackaged.

Figure 8A:
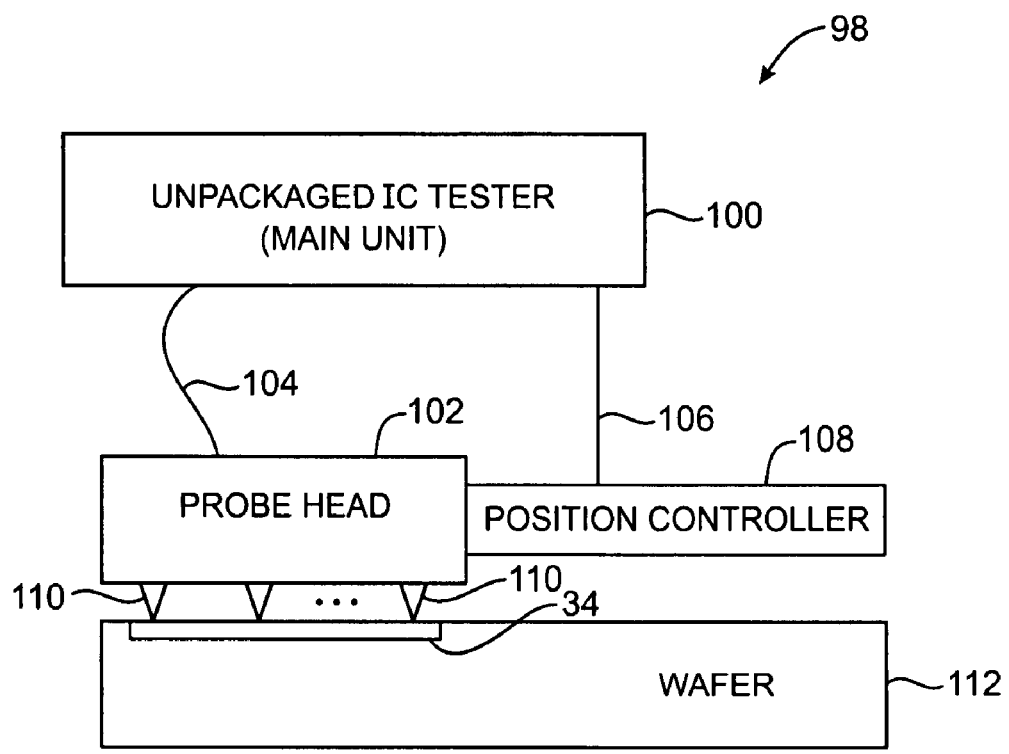
FIG. 8A is a diagram of an illustrative unpackaged integrated circuit tester in accordance with the present invention.
Figure 8B:
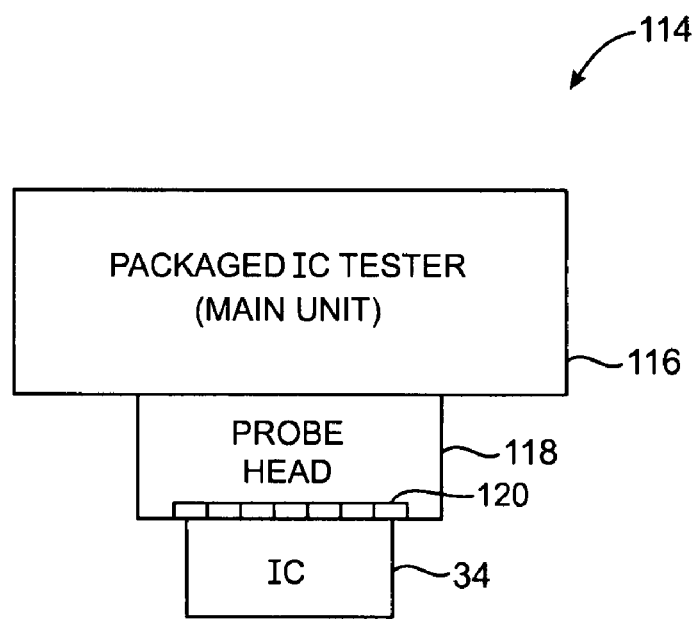
FIG. 8B is a diagram of an illustrative packaged integrated circuit tester in accordance with the present invention.

Illustrative testers that may be used to test packaged and unpackaged integrated circuits 34 are shown in FIGS. 8A and 8B. FIG. 8A shows a tester 98 that is used to test unpackaged integrated circuits. FIG. 8B shows a tester 114 that is used to test packaged integrated circuits.

As shown in FIG. 8A, tester 98 may include a main unit 100. Unpackaged integrated circuit tester main unit 100 includes computing equipment that provides test configuration data and test vectors for testing programmable integrated circuit 34. Main unit can also gather and analyze output signals from circuit 34 to determine whether circuit 34 is performing properly. Main unit 100 is connected to a probe head 102 via cable 104. Path 106 is used to connect main unit 100 to position controller 108. Position controller 108 is used to adjust the location of probe head 102 (e.g., using an x-y-z translation stage or other suitable position controlling equipment). Using position controller 108, the main unit 100 can position probe head 102 over various different integrated circuits in wafer 112. An illustrative integrated circuit 34 at which position controller 108 has located probe head 102 is shown in FIG. 8A.

Probe head 102 preferably has probe tips 110. Main unit 100 is used to issue positioning instructions to position controller 108 that direct position controller 108 to position probe head 102 at a given integrated circuit 34. The positioning instructions also direct position controller 108 to position probe head 102 against integrated circuit 34 so that probe tips 110 make electrical contact with mating conductive pads on integrated circuit 34. After electrical contact has been established between tester 98 and integrated circuit 34, tester 98 can use main unit 100 to load test configuration data into the programmable logic of integrated circuit 34 and to apply test vectors.

In the example of FIG. 8A, integrated circuits 34 are tested before packaging operations are performed using the packager 88 of FIG. 7. Integrated circuits 34 may, for example, be tested while they are still part of a wafer containing one or more integrated circuits such as wafer 112. After packaging, integrated circuits 34 can be tested using the tester 114 of FIG. 8B.

As shown in FIG. 8B, packaged integrated circuit tester 114 includes a main unit 116. Main unit 116 includes computing equipment that provides test configuration data and test vectors to integrated circuit 34. As the integrated circuit 34 responds to the applied test vectors, the main unit 116 can be used to gather output data from circuit 34 and can analyze this data to determine whether integrated circuit 34 is performing properly. Main unit 116 is electrically connected to probe head 118. Probe head 118 has probe tips or other suitable conductive structures 120 that mate with the pins of the package of integrated circuit 34. Positioning equipment may be used to position each integrated circuit 34 that is to be tested into electrical contact with tester 114 as shown in FIG. 8B.

During testing, both packaged integrated circuit testers and unpackaged integrated circuit testers load test configuration data into integrated circuits 34 through the points of contact between the probe heads and the internal circuitry of circuits 34. These contact points are sometimes referred to as "probe points." In unpackaged integrated circuit testers such as unpackaged integrated circuit tester 98 of FIG. 8A, the probe points are contact pads on circuit 34, because the probe head 102 makes electrical contact directly with these contact pads on the integrated circuit package. In packaged integrated circuit testers such as packaged integrated circuit tester 114 of FIG. 8B, the probe points are the pins on the package (regardless of shape), because the probe head 118 makes electrical contact with the pins of the package of the integrated circuit.

Figure 9:
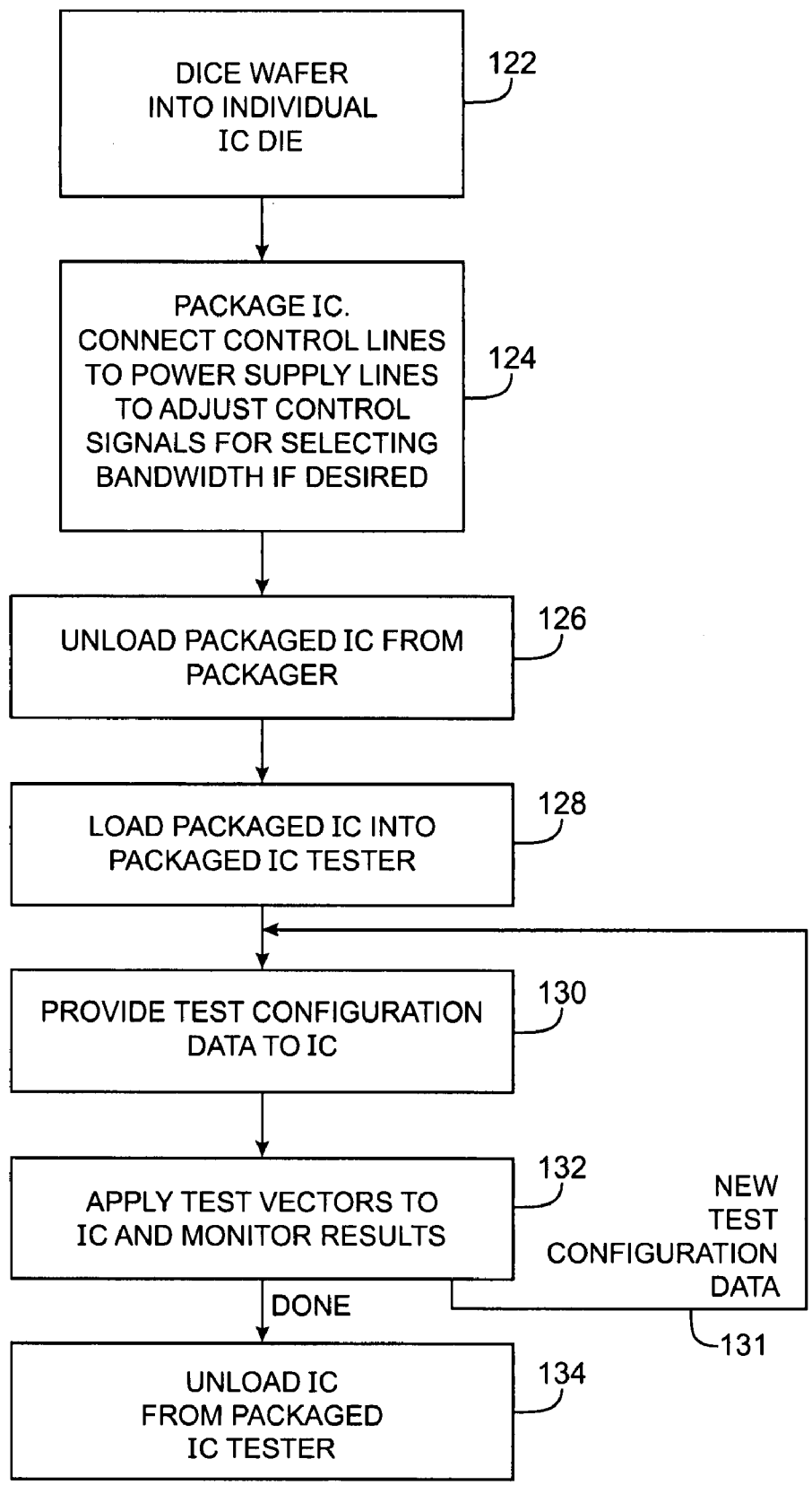
FIG. 9 is a flow chart of illustrative steps involved in using adjustable bandwidth test configuration data loading circuitry in the testing of a programmable integrated circuit in a packaged integrated circuit tester in accordance with the present invention.

Illustrative steps involved in testing packaged integrated circuits 34 are shown in FIG. 9.

At step 122, the wafer 112 (FIG. 8A) containing the integrated circuits 34 is separated into individual unpackaged integrated circuits. The circuits 34 may be separated by sawing the wafer 112, by cleaving the wafer 112, etc.

At step 124, the integrated circuits 34 are packaged into individual packages using packager 88 (FIG. 7). During packaging, the pins of the packages are connected to respective circuitry in integrated circuits 34. If a hardwired approach is being used to adjust circuit 42, the packager 88 (FIG. 7) or other suitable equipment may make connections 86 (FIG. 6C) between lines 80 and 82 and input 46 so that appropriate hardwired static control signals are applied to input 46 when circuit 34 is powered up during testing.

At step 126, after the integrated circuits 34 have been packaged, the packaged integrated circuits 34 are unloaded from packager 88.

At step 128, a packaged integrated circuit 34 is loaded into packaged integrated circuit tester 114 (FIG. 8B). When loaded into tester 114, the probe points on integrated circuit 34 make electrical contact with mating portions of probe head 118. The tester 114 applies power to integrated circuit 34 (e.g., by applying sources of positive voltage Vcc and ground potential Vss to the integrated circuit through head 118 or other electrical paths). If a hardwired arrangement has been used to apply the control signals to input 46 of adjustable circuit 42, the application of power to the lines 80 and 82 will generate the control signals and will adjust circuit 42 accordingly. If a non-hardwired control signal arrangement is used, tester 114 uses main unit 116 and probe head 118 to apply the desired control signals to circuit 42 in real time (e.g., using an arrangement of the type shown in FIG. 6A or an arrangement of the type shown in FIG. 6B).

During adjustments to circuit 42, the bandwidth of the path through which test configuration data is loaded is modified in view of the number of probe points available. If many pins are available for loading test data, the circuit 42 can be adjusted so that bypass lines 60 are switched into use or so that a relatively low-ratio time-division-multiplexing circuit 62 such as 2:1 circuit 68 or 3:1 circuit 70 is switched into use. If few pins are available, the circuit 42 can be adjusted to switch a higher-ratio time-division-multiplexing circuit into use. By adjusting bus width circuit 42, the test configuration data loading capabilities of integrated circuit 34 can be tailored to the package in which the integrated circuit 34 has been installed.

After adjustments have been made to circuit 42, the main unit 116 of tester 114 uses probe head 118 to provide test configuration data to the integrated circuit 34 at step 130. The test configuration data passes through the adjustable circuit 42 and into the programmable elements on the integrated circuit 34. If there are multiple rows or other such regions of programmable elements, a row select or region select signals can be applied by the tester to ensure that the test configuration data is loaded correctly. These loading operations program the programmable logic on integrated circuit 34 and prepare circuit 34 for the application of test vectors.

At step 132, the tester 114 applies a series of test vectors to the integrated circuit 34 and monitors the corresponding results. This allows the tester to analyze the performance of the integrated circuit.

As shown by line 131, the tester may obtain new test configuration data and the process of steps 130 and 132 may be repeated (e.g., hundreds or thousands of times). Steps 130 and 132 may be repeated until all sets of desired test configuration data have been applied and the results associated with each different set of test configuration data and associated test vectors have been gathered and analyzed.

At step 134, when testing is complete, the packaged integrated circuit may be unloaded from the packaged integrated circuit tester. If the integrated circuit performs properly during testing, it may be sold to a customer. If an error is detected, the integrated circuit may be repaired or other suitable actions may be taken.

Figure 10:
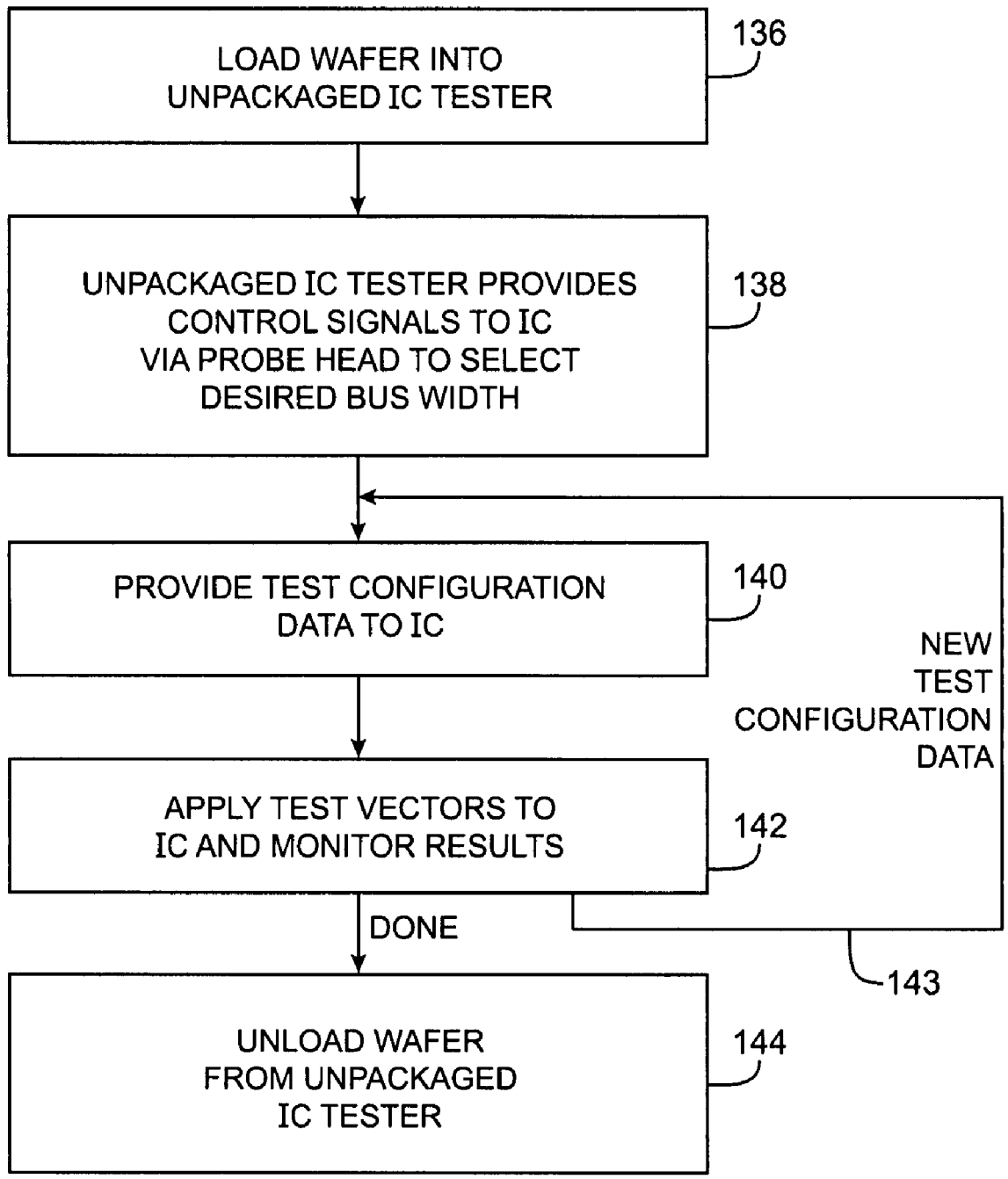
FIG. 10 is a flow chart of illustrative steps involved in using adjustable bandwidth test configuration data loading circuitry in the testing of a programmable integrated circuit in an unpackaged integrated circuit tester.

Illustrative steps involved in testing an unpackaged integrated circuit 34 are shown in FIG. 10.

At step 136, a wafer containing the integrated circuit 34 is loaded into an unpackaged integrated circuit tester 98 (FIG. 8A). An unpackaged integrated circuit 34 may be in wafer form (i.e., as shown by wafer 112 in FIG. 8A) or may be in the form of a part of a wafer or an individual die. In the example of FIG. 10, the unpackaged integrated circuit 34 is part of a wafer.

At step 138, the unpackaged integrated circuit tester 98 provides control signals to the integrated circuit 34 using probe head 102. The control signals are used to adjust the bus width capabilities of adjustable circuit 42. In particular, the control signals may be used to make the bandwidth of circuit 42 as large as possible in view of the number of probe points available through which to load test configuration data. If many probe points are available, for example, a low-ratio time-division-multiplexing circuit 62 in circuit 42 or bypass conductors 60 may be switched into use. If few probe points are available, a higher-ratio time-division-multiplexing circuit 62 in circuit 42 may be switched into use.

At step 140, test configuration data is loaded into the integrated circuit using tester 98. The test configuration data programs the programmable logic in the circuit 34.

At step 142, test vectors are applied to the programmed integrated circuit 34 using tester 98. A series of test vectors may be applied. While test vectors are being applied, the resulting output signals may be monitored to determine whether the integrated circuit 34 is performing properly.

As shown by line 143, the tester may obtain additional test configuration data and the process of steps 140 and 142 may be repeated (e.g., hundreds or thousands of times) until all sets of desired test configuration data have been applied and the results associated with each different set of test configuration data and associated test vectors have been gathered and analyzed.

When testing is complete, the wafer 112 may be unloaded from the tester 98 (step 144).

Figures 11A, 11B:
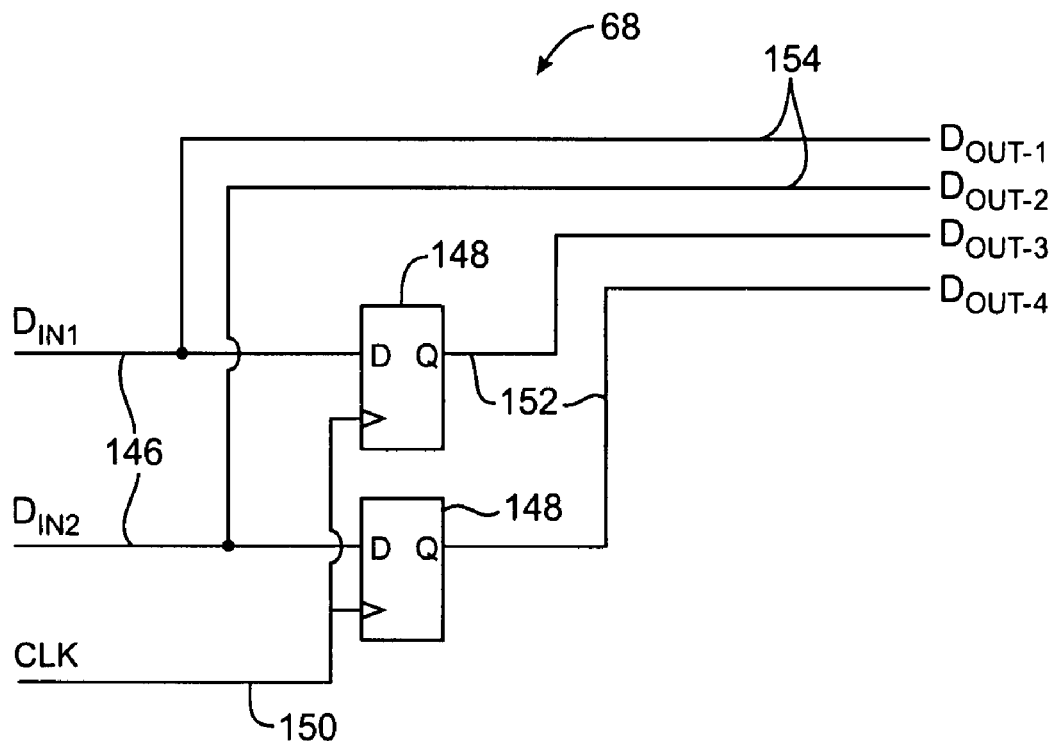
FIG. 11A is a circuit diagram of an illustrative 2:1 time-division-multiplexing circuit that reduces the number of lines used for loading test configuration data by a factor of two in accordance with the present invention.
FIG. 11B is a table illustrating the operation of the time-division-multiplexing circuit of FIG. 11A.

Any suitable circuitry can be used to provide the data multiplexing capabilities of circuits 62 in circuit 42 of FIG. 5. An illustrative circuit that may be used to provide a 2:1 time-division-multiplexing circuit such as circuit 68 of FIG. 5 is shown in FIG. 11A. FIG. 11B is a table showing how the circuit of FIG. 11A takes data on two input lines $D_{IN1}$ and $D_{IN2}$ (i.e., two lines 40 in FIG. 5) and produces data on four corresponding output lines $D_{OUT-1}$, $D_{OUT-2}$, $D_{OUT-3}$, and $D_{OUT-4}$ (i.e., four lines 66 connected to four lines 44 in FIG. 5).

As shown in FIG. 3A, test configuration data is input on two lines 146. In each clock cycle, two bits of test configuration data are received. The test configuration data on lines 146 is provided to the "D" inputs of registers 148. Registers 148 receive a clock signal via clock input 150. Each register 148 has a Q output. After clocking, the data at the D inputs of registers 148 appears at the Q outputs of registers 148. The outputs of registers 148 are connected to two parallel lines 152. Lines 152 form half of the output lines of circuit 68. The other half of the output lines are formed by lines 154 that are connected to the inputs 146.

The operation of circuit 68 as the test configuration data is loaded is shown in FIG. 11B. Initially, at time T1, the tester provides test configuration data $D_{IN1}$(T1) and $D_{IN2}$(T1) on lines 146. This data is provided to output lines 154 as the $D_{OUT-1}$ and $D_{OUT-2}$ signals, as shown by the entries $D_{IN1}$(T1) and $D_{IN2}$(T1) in the first and second rows of the first column of the table of FIG. 11B. At time T1, the states of the other two output lines ($D_{OUT-3}$ and $D_{OUT-4}$) are undefined.

When a clock is applied to registers 148 at time T1, the registers 148 capture the values of $D_{IN1}(T1)$ and $D_{IN2}(T1)$ from lines 146. The captured values $D_{IN1}(T1)$ and $D_{IN2}(T1)$ are provided as outputs $D_{OUT-3}$ and $D_{OUT-4}$ on output lines 152 at time T2, as shown by the entries in rows 3 and 4 in the second column of the table of FIG. 11B. At time T2, new test configuration data $D_{IN1}(T2)$ and $D_{IN2}(T2)$ that has been provided by the tester is passed to outputs $D_{OUT-1}$ and $D_{OUT-2}$ by lines 154, as shown by the first and second rows in the second column of the table of FIG. 11B. As the second column of FIG. 11B demonstrates, 4 bits of test configuration data can be provided to the four outputs of circuit 68 by providing these data bits to inputs 146 in two stages of two bits each. During the first stage (T1), the first two of the four bits are captured. During the second stage (T2), these first two bits are retained and the second two of the four bits are received. The circuit 68 combines the captured values of the first two bits and the second two bits and provides these signals as the four output signals lines $D_{OUT-1}$, $D_{OUT-2}$, $D_{OUT-3}$, and $D_{OUT-4}$.

Figure 12:
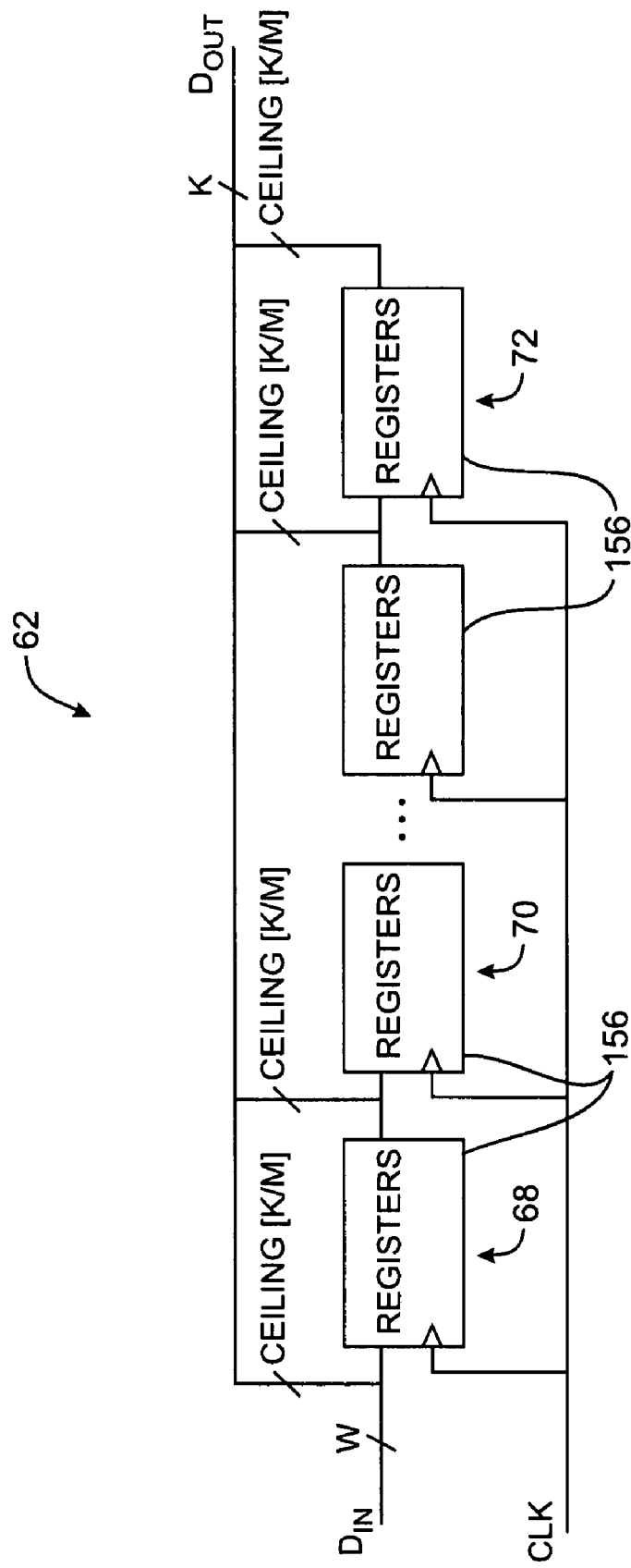
FIG. 12 is a circuit diagram of a generalized version of the illustrative time-division-multiplexing circuit of FIG. 11A in accordance with the present invention.

The example of FIG. 11A is a 2:1 time-division-multiplexing circuit of the type that may be used for circuit 68 of FIG. 5. If general, circuit 68 can have any suitable number of inputs. For example, circuit 68 can have 7 inputs, 7 registers 148 and 14 output lines. Moreover, multiple sets of registers may be provided to provide the full functionality of time-division-multiplexing circuit 62 of FIG. 5. This type of arrangement is shown in FIG. 12. Circuit 62 contains multiple stages 156, each of which contains corresponding registers 148 as described in connection with FIGS. 11A and 11B. As shown in FIG. 12, stages 156 are cascaded to form the time-division-multiplexing circuits 68, 70, and 72 of FIG. 5.

It is not always desirable to use the full range of capabilities provided by the circuitry of circuit 42 of FIG. 5. For example, a programmable logic device integrated circuit designer may know that a given family of programmable logic device integrated circuit will require only the flexibility of a circuit 42 of the type shown in FIG. 13. With this illustrative arrangement, circuit 42 has only a 2:1 time-division multiplexing circuit 68, a 3:1 time-division multiplexing circuit 70, and a 4:1 time-division-multiplexing circuit 156. The control signals applied to the input 74 of multiplexer 64 in FIG. 13 are used to adjust the bandwidth of circuit 42 between three states.

In particular, if the integrated circuit 34 is being packaged in a package with few available input pins 38, circuit 42 may be adjusted to switch circuit 156 into place, as this provides the greatest possible expansion of signals (i.e., a 4× expansion). If the integrated circuit 34 is being packaged in a package with many available input pins 38, circuit 42 may be adjusted to switch circuit 68 into place, as this provides a modest amount of bus-width expansion (2×). Circuit 70 may be switched into place to accommodate packages with pin counts between these two extremes. Because circuits such as circuit 42 of FIG. 13 do not have as much circuitry as circuits of the type shown in FIG. 5, circuits of the type shown in FIG. 13 use fewer on-chip resources and may therefore be more economical, provided that the reduced flexibility of circuit 42 is acceptable.

Figure 13:
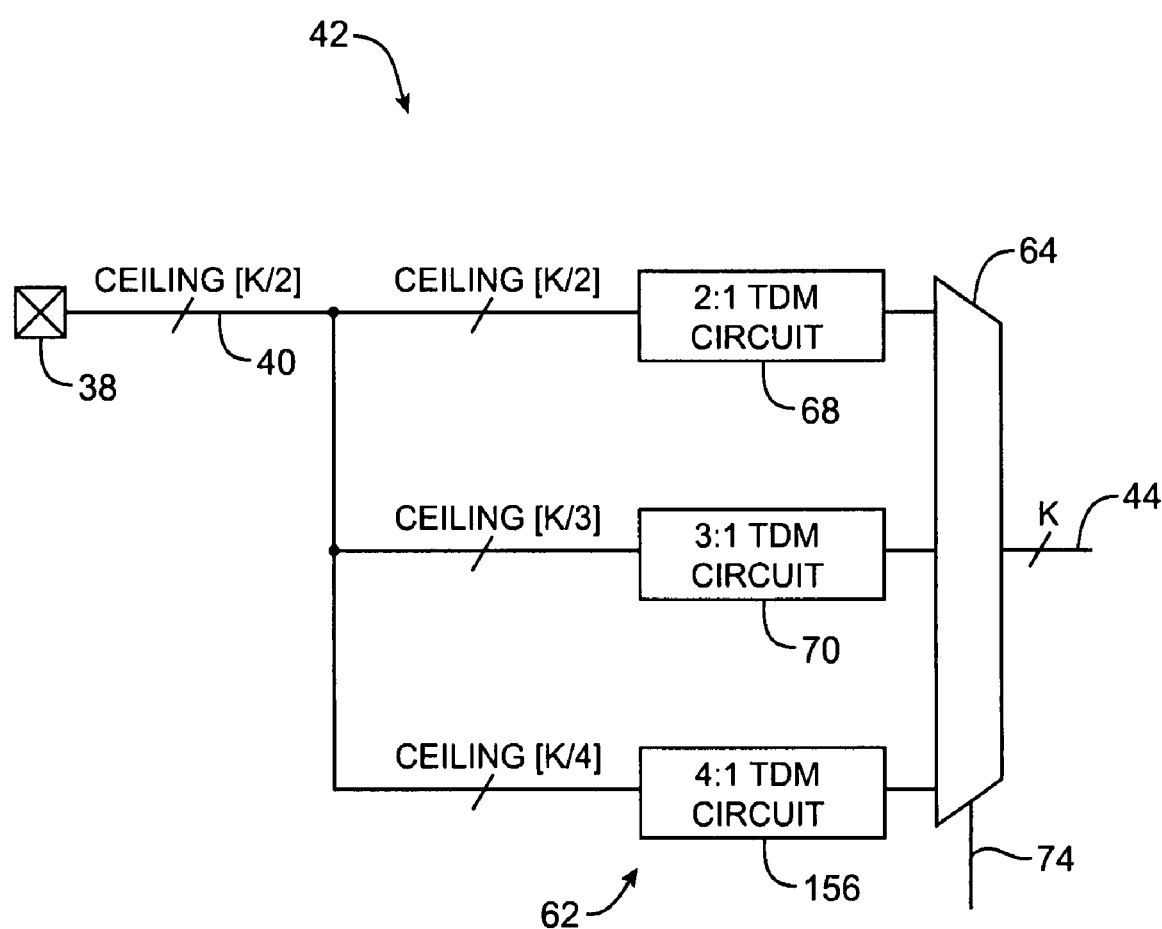
FIG. 13 is a circuit diagram of an illustrative test configuration data loading circuit with three time-division-multiplexing circuits of different ratios for use in testing a programmable integrated circuit in accordance with the present invention.
Figure 14:
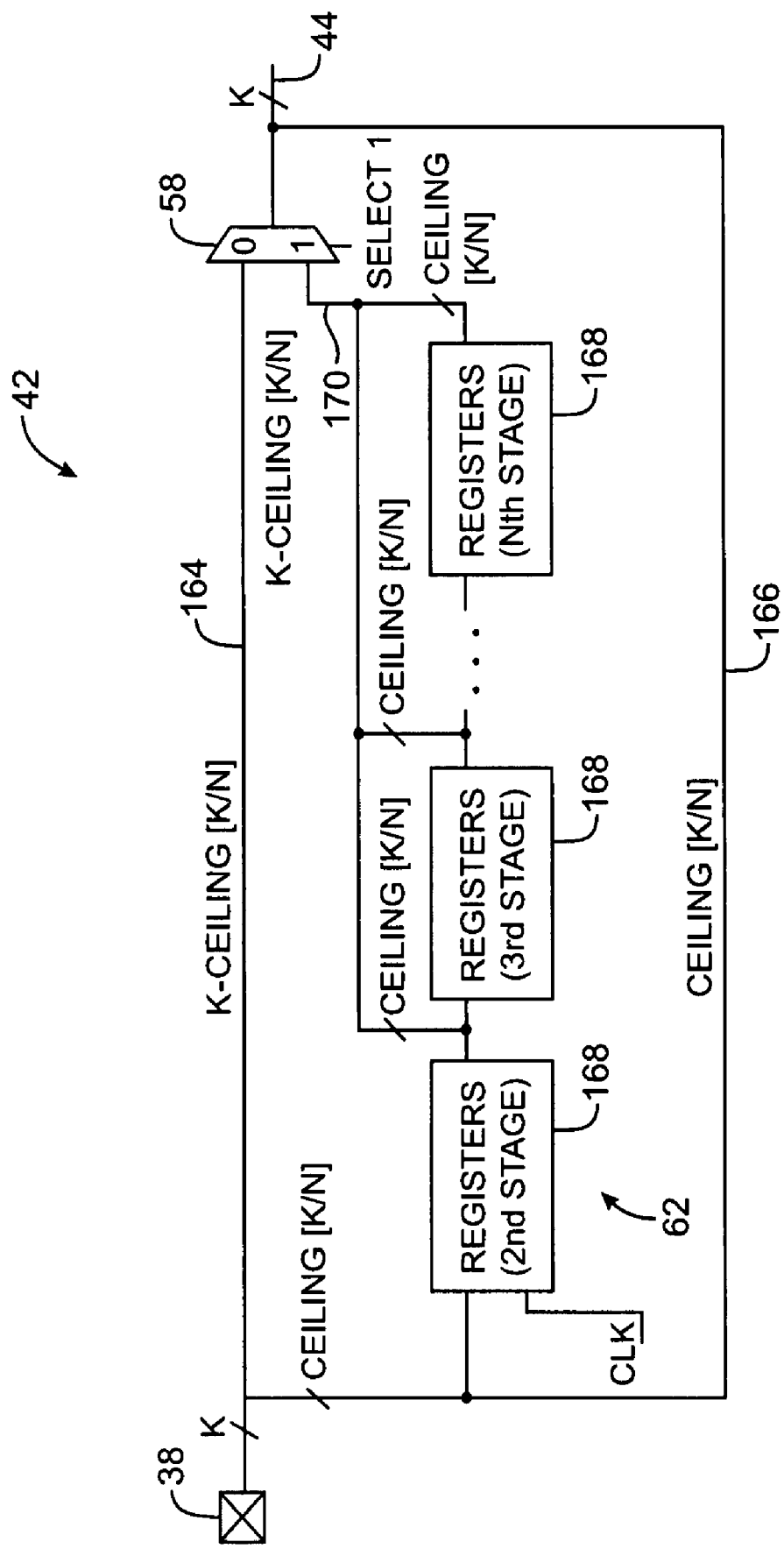
FIG. 14 is a circuit diagram of an illustrative hardware-optimized test configuration data loading circuit in accordance with the present invention.

The illustrative test configuration data loading circuit 42 of FIG. 13 has three parallel TDM circuits 62. An illustrative hardware-optimized test configuration data loading circuit in which a single TDM circuit 62 is used is shown in FIG. 14. The circuit 42 of FIG. 14 may be used by a programmable logic device integrated circuit designer who desires to conserve hardware resources on an integrated circuit while implementing dynamic test mode switching.

With the arrangement of FIG. 14, the SELECT1 control signal for multiplexer 58 may be set to either "1" or "0". No SELECT2 control signal is needed, because no multiplexer 64 (FIG. 5) is used.

If the SELECT1 control signal is set to "0," test configuration data may be loaded through lines 164 and 166. In this configuration, circuit 42 has its maximum bandwidth and uses the largest number of input pins 38. If the SELECT1 control signal is set to "1," test configuration data may be loaded through lines 170 and lines 166. In this configuration, circuit 42 uses the registers logic in register stages 168 to implement an N:1 ratio time-division multiplexing circuit, as described in connection with FIGS. 11A, 11B, and 12.

Hardware-optimized circuits 42 of the type shown in FIG. 14 offer less flexibility than fully-configurable circuits 42 of the type shown in FIG. 5, but conserve resources. Resources are conserved in the FIG. 14 arrangement, because the SELECT2 multiplexer 64 (FIG. 5) is not used and the size of the SELECT1 multiplexer is reduced from K to K-CEILING[K/N].

Figure 15:
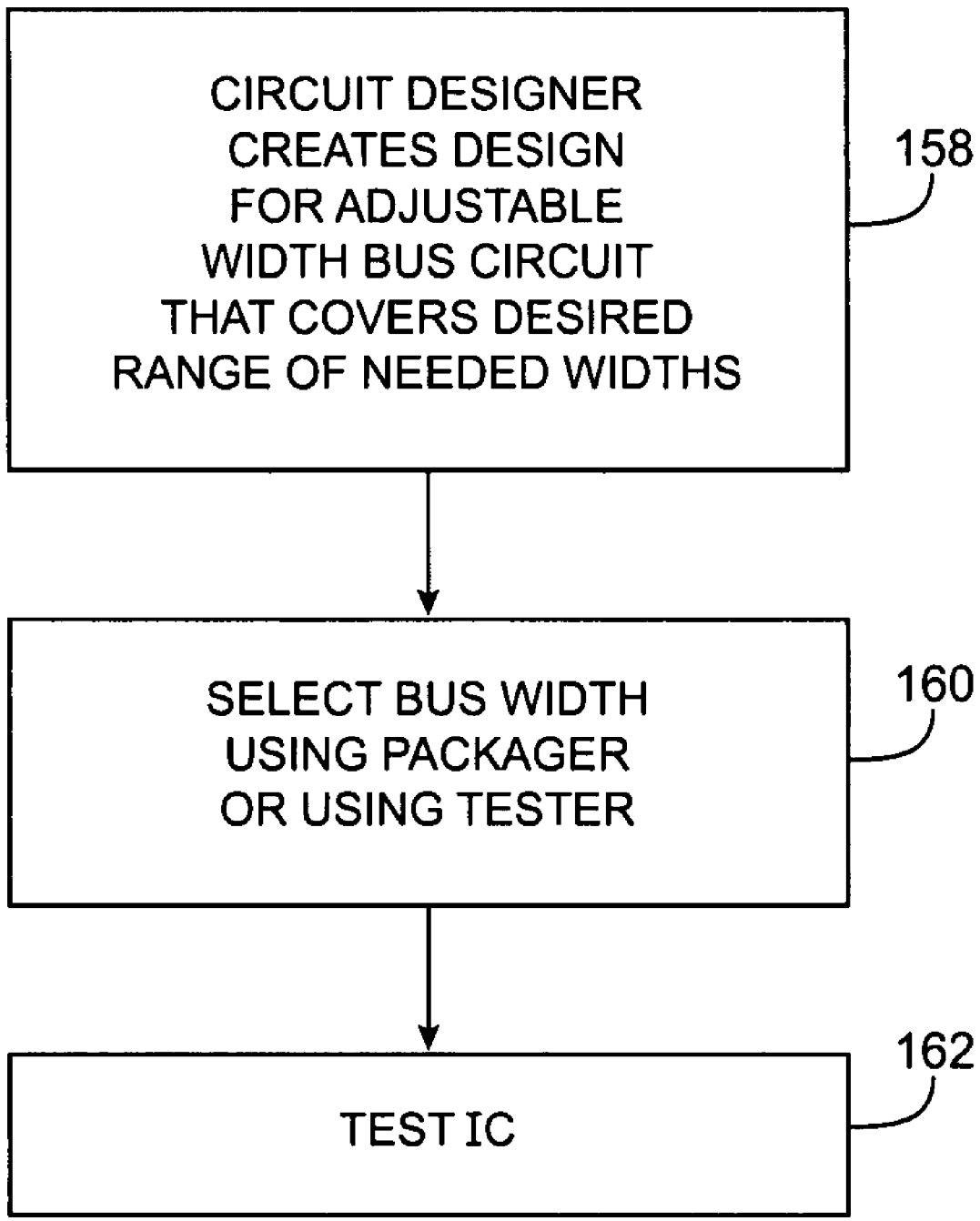
FIG. 15 is a flow chart of illustrative steps involved in testing a programmable integrated circuit containing an adjustable-bandwidth circuit having an architecture optimized by a programmable integrated circuit designer for use with a particular type of programmable integrated circuit in accordance with the present invention.

Illustrative steps involved in using circuits 42 to provide flexible bandwidth capabilities for testing programmable integrated circuits such as programmable logic devices are shown in FIG. 15.

At step 158, given the specifications for a family of programmable integrated circuit products, a programmable integrated circuit designer creates a design for an appropriate test configuration data loading circuit 42. The circuit 42 should have sufficient operating modes to be flexible enough to cover the designer's needed range of test configuration data loading bandwidths. If the range of products covers many different programmable integrated circuit designs and/or many different packages, a relatively flexible circuit will be required. Less flexible circuits 42 may be used if less flexibility is needed.

By selecting an appropriate range of bus widths (bandwidths) rather than constructing circuit 42 to cover all possible contingencies, circuit resources may be conserved.

At step 160, after the integrated circuits 34 containing circuits 42 have been fabricated, a tester may be used to dynamically apply control signals to the circuits 42 to make dynamic test mode adjustments. In particular, the applied control signals are used to make bus width adjustments that alter the bandwidth of circuits 42 as needed to optimize test configuration data loading operations. Any of the illustrative approaches for applying control signals described in connection with FIGS. 6A, 6B, and 6C may be used.

At step 162, after each test configuration data loading circuit's test mode has been set so that its bus width and bandwidth are adjusted as desired, test configuration data may be loaded and test vectors may be applied to test the operation of the circuit. The test configuration data loading process may be repeated and multiple test vectors may be applied for each different set of test configuration as described in connection with FIGS. 9 and 10.

The foregoing is merely illustrative of the principles of this invention and various modifications can be made by those skilled in the art without departing from the scope and spirit of the invention.

What is claimed is:

1. A programmable integrated circuit, comprising:
    programmable logic;
    a plurality of rows of programmable elements that are loaded with test configuration data from a tester to program the programmable logic;
    a plurality of pins, each of which receives the test configuration data from the tester;
    a first bus that receives the test configuration data from the tester, wherein the first bus has a plurality of lines, each of which is provided with the test configuration data from a respective one of the plurality of pins;

a second bus having a plurality of lines that provides the test configuration data to the programmable elements, wherein each of the rows of programmable elements receives test configuration data from each of the lines in the second bus; and a test configuration data loading circuit with dynamic mode switching that routes the test configuration data from the first bus to the second bus.

2. The programmable integrated circuit defined in claim 1 wherein the test configuration data loading circuit comprises a time-division-multiplexing circuit having a number of inputs coupled to the lines in the first bus and a number of outputs coupled to the lines in the second bus.

3. The programmable integrated circuit defined in claim 1 wherein the test configuration data loading circuit comprises a time-division-multiplexing circuit having inputs coupled to the lines in the first bus and outputs coupled to the lines in the second bus and wherein when the test configuration data is received from the tester, the time-division-multiplexing circuit routes the test configuration data from a given number of the inputs to a number of the outputs that is larger than the given number.

4. The programmable integrated circuit defined in claim 1 wherein the test configuration data loading circuit comprises:

time-division multiplexing circuitry coupled between the first bus and the second bus; and bypass lines coupled between the first bus and the second bus; and multiplexer circuitry that is configurable to selectively switch the bypass lines into use to bypass the time-division multiplexing circuitry.

5. The programmable integrated circuit defined in claim 1 wherein the test configuration data loading circuit comprises a control input that receives a hardwired control signal.

6. The programmable integrated circuit defined in claim 1 wherein the test configuration data loading circuit comprises an adjustable bandwidth circuit.

7. A programmable integrated circuit, comprising:
programmable logic;
a plurality of rows of programmable elements that are loaded with test configuration data from a tester to program the programmable logic;
a plurality of pins, each of which receives the test configuration data from the tester;

a plurality of first lines, wherein at least some of the first lines each receive the test configuration data from a respective one of the pins;

a plurality of second lines arranged in a bus, wherein each of the rows of programmable elements receives test configuration data from each of the second lines in the bus; and time-division-multiplexing circuitry that routes the test configuration data from the first lines that have received the test configuration data to the second lines.

8. The programmable integrated circuit defined in claim 7 further comprising:

bypass lines connected in parallel with the time-division-multiplexing circuitry; and a multiplexer responsive to control signals to selectively switch either the bypass lines into use or the time-division-multiplexing circuitry into use to route the test configuration data from the first lines to the second lines when loading the test configuration data into the programmable elements.

9. The programmable integrated circuit defined in claim 7 wherein the time-division-multiplexing circuitry comprises a plurality of time-division-multiplexing circuits each of which receives some of the test configuration data from the first lines and wherein the programmable integrated circuit further comprises multiplexing circuitry coupled to each of the time-division multiplexing circuits.

10. The programmable integrated circuit defined in claim 7 wherein the time-division-multiplexing circuitry comprises a plurality of time-division-multiplexing circuits each of which receives some of the test configuration data from the first lines, wherein the programmable integrated circuit further comprises multiplexing circuitry coupled to each of the time-division multiplexing circuits, and wherein the multiplexing circuitry is responsive to a bandwidth adjusting control signal.

11. The programmable integrated circuit defined in claim 7 wherein the bus comprises at least ten of the second lines and has a bus width of ten.

12. The programmable integrated circuit defined in claim 7 wherein the bus comprises at least seventy of the second lines and has a bus width of seventy.

* * * * *